(12) United States Patent
Tang (10) Patent No.: US 9,082,710 B2
(45) Date of Patent: Jul. 14, 2015

(54) CHIP PACKAGING SUBSTRATE AND CHIP PACKAGING STRUCTURE

(71) Applicant: ChipMOS Technologies, Inc., Hsinchu (TW)

(72) Inventor: Ying-Tai Tang, Hsinchu (TW)

( * ) Notice: Subject to any disclaimer, the term of this patent is extended or adjusted under 35 U.S.C. 154(b) by 0 days.

(21) Appl. No.: 13/849,294

(22) Filed: Mar. 22, 2013

(65) Prior Publication Data

US 2013/0248863 A1    Sep. 26, 2013

(30) Foreign Application Priority Data

Mar. 23, 2012   (TW) .............................. 101110027 A (51) Int. Cl.
*H01L 23/58*   (2006.01)
*H01L 21/66*   (2006.01)
*H01L 23/498*   (2006.01)

(52) U.S. Cl.
CPC ................ *H01L 22/30* (2013.01); *H01L 22/32* (2013.01); *H01L 23/49838* (2013.01); *H01L 2224/16238* (2013.01); *H01L 2224/32225* (2013.01); *H01L 2224/73204* (2013.01)

(58) Field of Classification Search
CPC ... H01L 23/5226; H01L 23/528; H01L 23/48; H01L 23/544; H01L 23/481
USPC ............ 257/735, 773, 774, 692, 698, E23.01, 257/E23.06, E23.065, E23.067
See application file for complete search history.

(56) References Cited

U.S. PATENT DOCUMENTS

| | | | |
|---|---|---|---|
| 6,509,631 B2 * | 1/2003 | Toyosawa ...................... | 257/668 |
| 6,937,047 B2 * | 8/2005 | Tran et al. ................... | 324/750.3 |
| 7,345,366 B2 * | 3/2008 | Jow et al. ...................... | 257/758 |
| 8,017,943 B2 * | 9/2011 | Ojiro ............................... | 257/48 |
| 8,310,068 B2 * | 11/2012 | Sasaki ........................... | 257/786 |
| 2004/0242027 A1 * | 12/2004 | Tanokura et al. ............... | 439/60 |
| 2004/0245628 A1 * | 12/2004 | Chung .......................... | 257/734 |
| 2005/0116338 A1 * | 6/2005 | Hirai .............................. | 257/734 |
| 2006/0181299 A1 | 8/2006 | Hirae | |
| 2008/0258290 A1 * | 10/2008 | Nakajima ..................... | 257/690 |
| 2008/0308798 A1 * | 12/2008 | Komatsu ......................... | 257/48 |
| 2009/0322362 A1 * | 12/2009 | Lim et al. ..................... | 324/754 |
| 2012/0097944 A1 * | 4/2012 | Lin et al. ......................... | 257/48 |
| 2013/0240917 A1 * | 9/2013 | Cho et al. ........................ | 257/88 |

FOREIGN PATENT DOCUMENTS

| | | | |
|---|---|---|---|
| CN | 101226227 A | | 7/2008 |
| KR | 20120027359 | * | 3/2012 |
| TW | 276356 | | 5/1996 |
| TW | 200616134 A | | 5/2006 |

* cited by examiner

*Primary Examiner* — Evan Pert
*Assistant Examiner* — Herve Assouman
(74) *Attorney, Agent, or Firm* — Richard C. Vershave; Foster Pepper PLLC (57) ABSTRACT

A chip packaging substrate includes a flexible substrate, a plurality of test pads, and a plurality of leads, wherein the flexible substrate has a first surface and a second surface, and the first surface has a user area and a test pad area configured thereon. The test pads are arranged in at least three rows within the test pad area. The lead connected to the test pad in the middle row includes a first section extending from the chip to the test pad area and a second section disposed on the second surface, wherein one end of the second section penetrates the flexible substrate to connect with the first section and the other end penetrates the flexible substrate to connect with the test pad, so as to increase the dimensions of the test pads.

6 Claims, 7 Drawing Sheets

(Prior Art)

CHIP PACKAGING SUBSTRATE AND CHIP PACKAGING STRUCTURE

PRIORITY CLAIM

This application claims the benefit of the filing date of Taiwan Patent Application No. 101110027, filed Mar. 23, 2012, entitled "CHIP PACKAGING SUBSTRATE AND CHIP PACKAGING STRUCTURE," and the contents of which is hereby incorporated by reference in its entirety.

FIELD OF THE INVENTION

The present invention relates to a chip packaging substrate and a chip packaging structure, and more particularly to a chip packaging substrate and a chip packaging structure having test pads with larger dimensions for improving the test accuracy.

BACKGROUND OF THE INVENTION

With the rapid development of optoelectronic technology in recent years, the electronic display devices become thinner and thinner while also provide high resolution, such as LCD (Liquid Crystal Display) or PDP (Plasma Display Panel). In general, TCP (Tape Carrier Package) and COF (Chip on Film) are most commonly used methods for packaging the driver IC chips of the thin display devices.

In the present processes of TCP/COF, the IC chips are mounted on the flexible substrate with leads (e.g., tape) and electrically connected to external electronic devices through the leads. Moreover, the chip packaging structures need to be tested and inspected for function checking and quality assurance after packaging. In order to test the electrical performance of the IC chips, the flexible substrate has a plurality of test pads connected to the leads configured thereon; that is to say, the testing instrument (e.g., probe card) can test the IC chips by probing these test pads.

Figure 1:
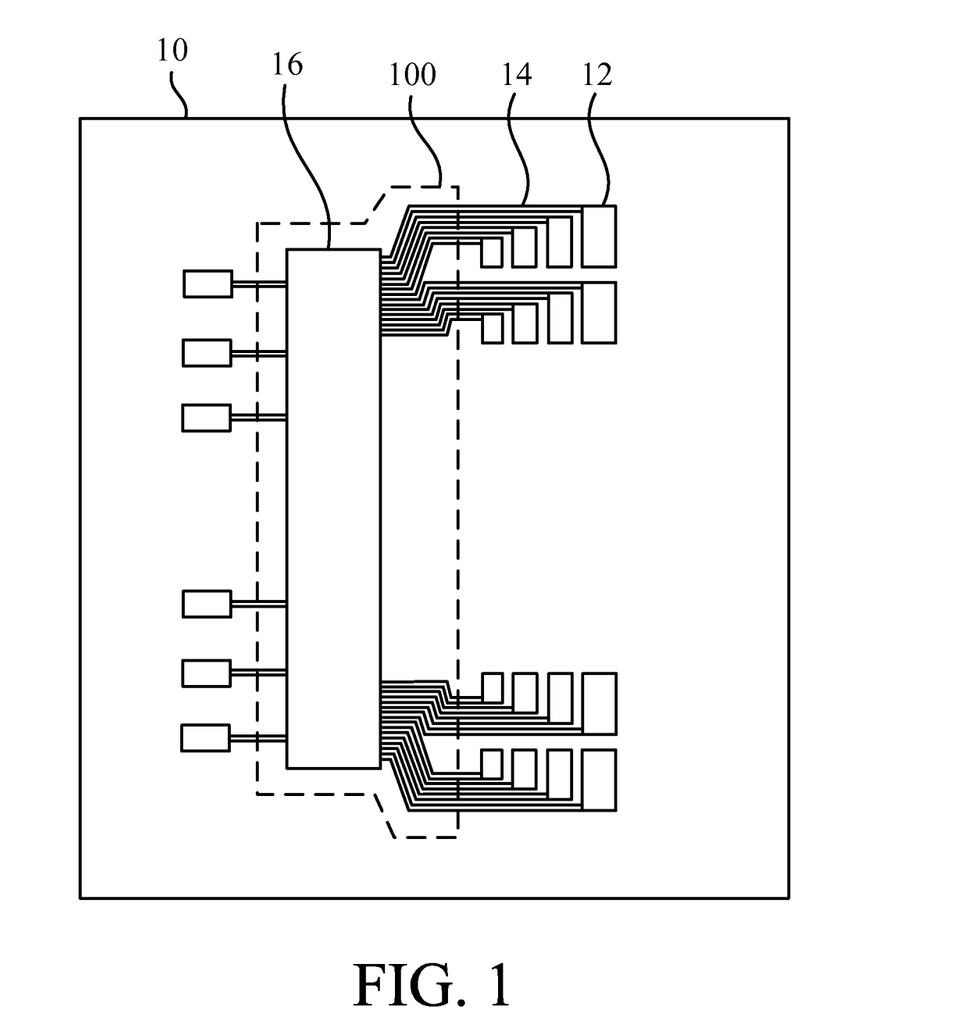
FIG. 1 is a schematic diagram illustrating a chip packaging structure of TCP/COF according to the prior art.

To meet the trend of lightweight, thinness, small form factor and multifunction of the electronic devices, IC chips need to be shrunk in size but still have high integration density; accordingly, the number of test pads on the flexible substrate has to be increased greatly as well. However, due to the limited space available on the flexible substrate, test pads are usually arranged in a multi-row stepped arrangement for more test pads to be accommodated therewithin. Please refer to FIG. 1, which is a schematic diagram illustrating a TCP/COF chip packaging structure 1 according to the prior art. As shown in FIG. 1, the chip 16, the test pads 12, and the leads 14 connecting the chip 16 and the test pads 12 are configured on the flexible substrate 10 of the TCP/COF chip packaging structure 1. In prior art, the chip packaging structure usually has a large number of test pads on the output side (i.e., the test pads 12 disposed at the test pad area on the right side of FIG. 1); the test pads 12 hence are arranged in multi-row stepped manner within the limited space. In this arrangement, the leads 14 connecting to the test pads 12 also occupy a part of the test pad area; hence, the test pads 12 gradually become smaller in size while getting closer to the user area 100.

Furthermore, the cantilever probe card is commonly used for testing the TCP/COF chip packaging structures. In general, the probes of the cantilever probe card have an inclined distal end; therefore, needle slippage may occur when the probe card is forced downward to contact with the test pads, that is to say, the probe tips may slip and shift from the expected position. For large test pads such as the test pads 12 at the rightmost row (i.e., the outermost row) in the test pad area as shown in FIG. 1, probe contact can still remain within the test pad even though the needle slippage occurs, causing no effect on the electrical contact. However, for small-sized test pads such as the test pads 12 at the innermost row in the test pad area as shown in FIG. 1, the probe needles may slide out of the test pads when needle slippage occurs, leading to inaccurate testing results.

SUMMARY OF THE INVENTION

An aspect of the present invention is to provide a chip packaging substrate and a chip packaging structure in order to improve the problem described previously.

According to an embodiment, the chip packaging substrate of the invention comprises a flexible substrate, a plurality of test pads and leads. The flexible substrate has a first surface and a second surface, and the first surface has a user area for a chip to be mounted thereon and a test pad area configured thereon, wherein the test pad area is adjacent to the user area. The chip packaging substrate and the chip disposed thereon form the chip packaging structure of the invention. The test pads are configured in the test pad area and arranged in at least three rows; the plurality of leads are at least formed on the user area, wherein one end of each lead is electrically connected to the chip, and the other end of each lead extends toward the test pad area and is connected to the corresponding test pad.

In this embodiment, at least a first lead connected to the test pad arranged in the middle row comprises a first section and a second section. The first section is configured on the first surface; moreover, the first section has a first end electrically connected to the chip and a second end extending to the test pad area. The second section is configured on the second surface, wherein one end of the second section penetrates the flexible substrate to connect with the second end of the first section and the other end penetrates the flexible substrate to connect with the corresponding test pad at the middle row. Accordingly, the layout space available in the test pad area can be increased so that the dimensions of the test pads in the innermost and the middle rows can be enlarged. Therefore, the possibility of probes being slipped out of the test pads can be reduced and the testing accuracy can be ensured.

Many other advantages and features of the present invention will be further understood by the detailed description and the accompanying sheet of drawings.

BRIEF DESCRIPTION OF THE DRAWINGS

To facilitate understanding, identical reference numerals have been used, where possible to designate identical elements that are common to the figures.

DETAILED DESCRIPTION

Figure 2A:
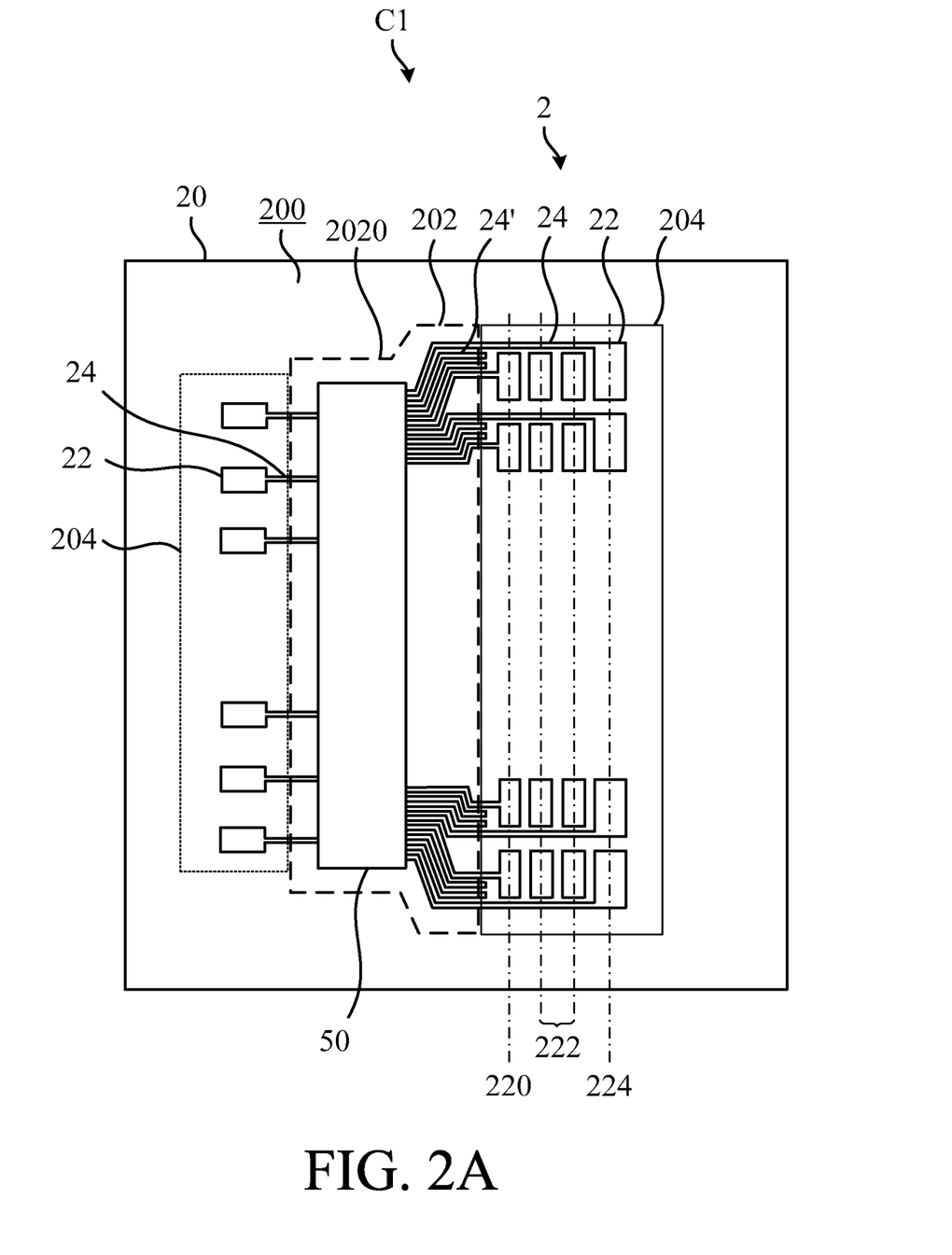
FIG. 2A is a schematic diagram illustrating a chip packaging structure according to an embodiment of the invention.

Please refer to FIG. 2A. FIG. 2A is a schematic diagram illustrating a chip packaging structure C1 according to an embodiment of the invention. As shown in FIG. 2A, the chip packaging structure C1 comprises a chip packaging substrate 2 and a chip 50, wherein the chip packaging substrate 2 further comprises a flexible substrate 20, a plurality of test pads 22 and a plurality of leads 24. In actual application, the flexible substrate 20 consists of flexible material, such as polyimide (PI).

The flexible substrate 20 has a first surface 200, and the first surface 200 has a user area 202 and a test pad area 204 configured thereon, wherein the test pad area 204 is adjacent to the user area 202. The chip 50 is disposed on the user area 202 of the first surface 200, and the test pads 22 are configured in the test pad area 204. In the embodiment, the chip packaging substrate 2 described above and the chip 50 disposed thereon constitute the chip packaging structure C1. In addition, the plurality of leads 24 are formed on the first surface 200 and at least on the user area 202 and extend toward the test pad area 204.

Besides, in this embodiment, the test pad areas 204 adjoin two opposite sides of the user area 202, wherein the test pad area 204 on one side can be an input side (i.e., the test pad area 204 on the left of the user area 202 in FIG. 2A), and the test pad areas 204 on the other side can be an output side (i.e., the test pad area 204 on the right of the user area 202 in FIG. 2A). Generally speaking, the output side has a much larger number of test pads 22 compared to the input side, thus the configuration of the test pads 22 in the output side is usually arranged in a multi-row manner, so as to have the space of the teat pad area 204 effectively used. As shown in FIG. 2A, the test pads 22 disposed at the right test pad area 204 (output side) are arranged and divided into an innermost row 220, at least one middle row 222, and an outermost row 224 depending on the distance to the user area 202, where the amount of rows of the at least one middle row 222 is determined by the number of test pads 22, and not limited to two rows as shown in the embodiment. In other embodiments, the configuration of the test pads 22 in the input side can be allocated to multiple rows according to the number of test pads 22 and the space available in the test pad area 204.

Figure 2B:
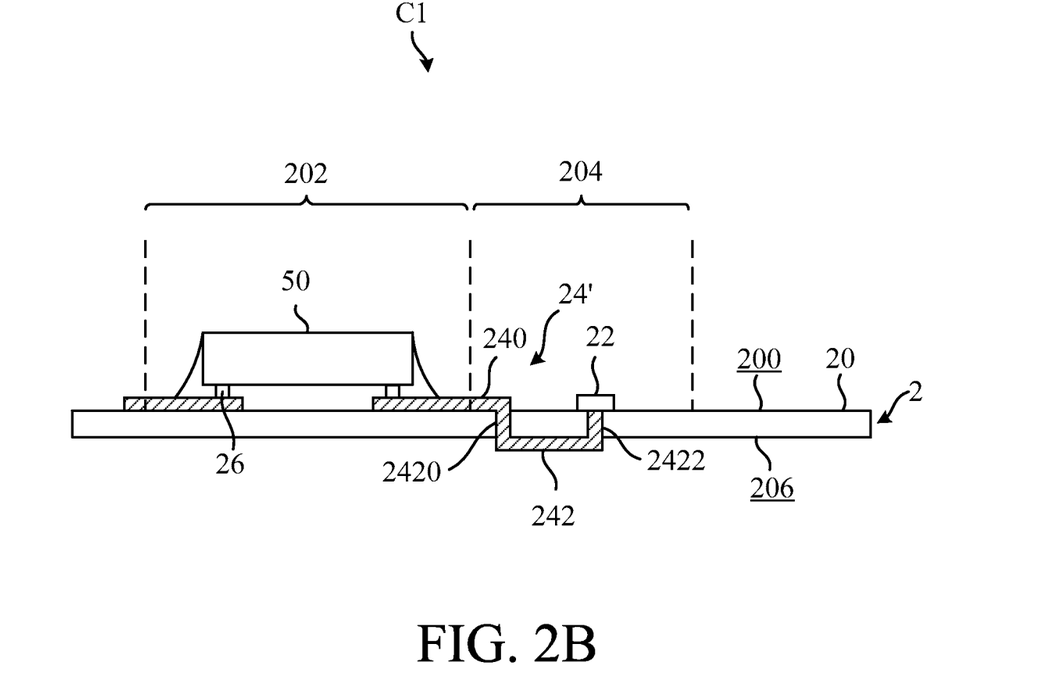
FIG. 2B is a sectional view illustrating the chip packaging structure according to FIG. 2A.

The leads 24 connect the chip 50 and the test pads 22; therefore, users can manipulate a probe card device to test the electrical performance of the chip 50 by probing the test pads 22. Please refer to FIG. 2B simultaneously. FIG. 2B is a sectional view illustrating the chip packaging structure C1 according to FIG. 2A. In general, each lead 24 with one end electrically connected to the chip 50 extends across the user area 202 toward the test pad area 204 with the other end connected to the corresponding test pad 22; in this embodiment, the leads 24 connected to the test pads 22 in the left test pad area 204 or to the test pads 22 at the innermost row 220 and the outermost row 224 in the right test pad area 204 are configured in this manner. On the other hand, the leads 24 have at least one first lead 24' which is partially formed on the first surface 200 and partially on the second surface 206 opposite to the first surface 200 of the flexible substrate 20. The first leads 24' connect to the test pads 22 in the middle row(s) 222. Moreover, the chip 50 is electrically connected with the leads 24, 24' through the bumps 26, wherein the bumps 26 can be electroplated bumps, for example, and the material can be selected from the group consisting of gold (Au), silver (Ag), copper (Cu), tin (Sn), indium (In), aluminum (Al), Ni/Au alloy, Ni/Pd/Au alloy, Cu/Ni/Au alloy, Cu/Au alloy, or their combinations.

As shown in FIG. 2B, the flexible substrate 20 has a second surface 206 opposite to the first surface 200. The first lead 24' connected to the test pad 22 in the middle row 222 comprises a first section 240 and a second section 242. The first section 240 is configured on the first surface 200 and has a first end electrically connected to the chip 50 through the bumps 26 and a second end opposite to the first end extending to the test pad area 204. The second section 242 is configured on the second surface 206 and comprises a first conductive via 2420 and a second conductive via 2422 which penetrate the flexible substrate 20. The first conductive via 2420 connects the second section 242 to the second end of the first section 240, and the second conductive via 2422 connects the second section 242 to the test pad 22 arranged in the middle row 222.

Figure 2C:
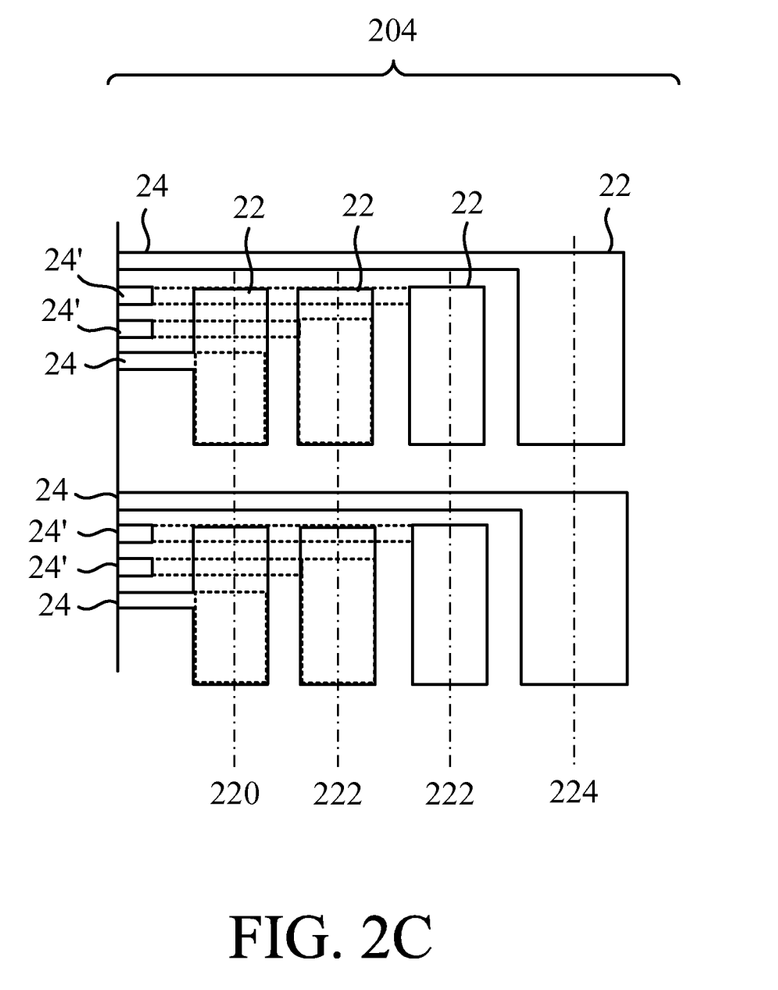
FIG. 2C is an enlarged view illustrating the test pad area of the chip packaging substrate according to FIG. 2A.

Please refer to FIG. 2C and 2B again. FIG. 2C is an enlarged view illustrating the test pad area 204 of the chip packaging substrate 2 according to FIG. 2A. As shown in FIG. 2C and 2B, the test pads 22 in the middle row(s) 222 are electrically connected with the second sections 242 of the first leads 24'; more specifically, the second sections 242 of the first leads 24' are situated within the range that the test pad area 204 projects on the second surface 206, and thus do not occupy the space of the test pad area 204 on the first surface 200. As shown in FIG. 2C, since the first leads 24' do not pass across the test pad area 204 on the first surface 200, the space available in the test pad area 204 for test pad layout is increased. Therefore, compared to the prior art, the dimensions of the test pads 22 in the innermost row 220 and the middle row(s) 222 can be increased so that the possibility of probes being slipped out of the test pads 22 can be prevented and the testing accuracy can be ensured. The dash lines in FIG. 2C outline the dimensions of the test pads and the leads according to the prior art; it can be seen obviously that in the present invention the test pads 22 in the middle rows 222 and the innermost row 220 have larger dimensions by contrast.

Figure 3:
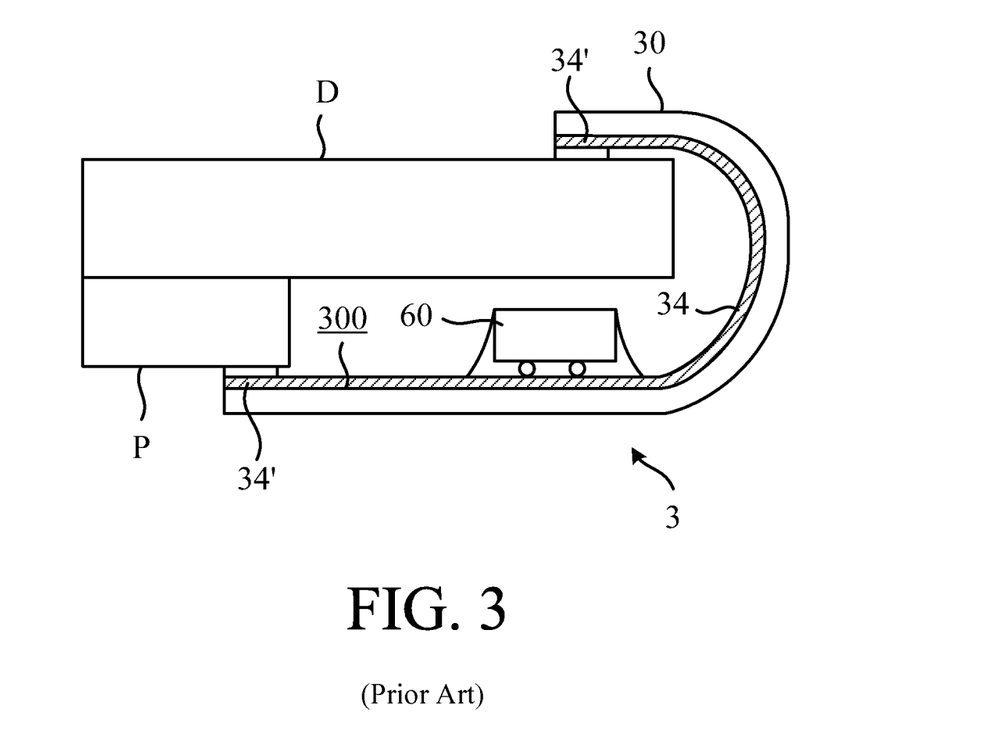
FIG. 3 is a schematic diagram illustrating a tape package structure applied to a liquid crystal display (LCD) according to the prior art.

Please refer to FIG. 2A again. In this embodiment, the user area 202 is defined by a cutting line 2020 which serves as a boundary between the user area 202 and the test pad area 204. In other words, the user area 202 can be trimmed off along the cutting line 2020 to form a single chip packaging structure after testing, such as a tape automated bonding driver device. In practical application, the ends of the leads 24 connected to the chip 50 are called inner leads, and the other ends of the leads 24 away from the chip 50 are called outer leads which are used to connect with other external components. Please refer to FIG. 3, which is a schematic diagram illustrating a tape package structure 3 applied to a liquid crystal display (LCD) according to the prior art. As shown in FIG. 3, the chip 60 and the leads 34 of the tape package structure 3 are both configured on the first surface 300 of the flexible substrate 30. While the tape package structure 3 is mounted on board, it would be bent to electrically connect with a glass panel D and a printed circuit board P through the output and input outer leads 34' on the first surface 300 respectively. Thus, if there are outer leads disposed on both surfaces of the flexible substrate 30, the on-board connection of the tape package structure 3 would be difficult.

In the embodiment, the second ends of the first sections 240 of the first leads 24' extend into the test pad area 204, and the second sections 242 of the first leads 24' are situated entirely within the range that the test pad area 204 projects on the second surface 206. In order to increase the layout space available in the test pad area 204, the second ends of the first sections 240 can terminate at a region between the cutting line 2020 and the test pads 22 arranged in the innermost row 220 to avoid the first leads 24' occupying too much space of the test pad area 204. As shown in FIG. 2B, with the configuration of the first leads 24' described above, all of the leads 24 (including the outer leads) of the individual chip packaging structure C1 after trimmed off are disposed on the first surface 200, thus causing no difficulty to the following on-board application.

Figure 4A:
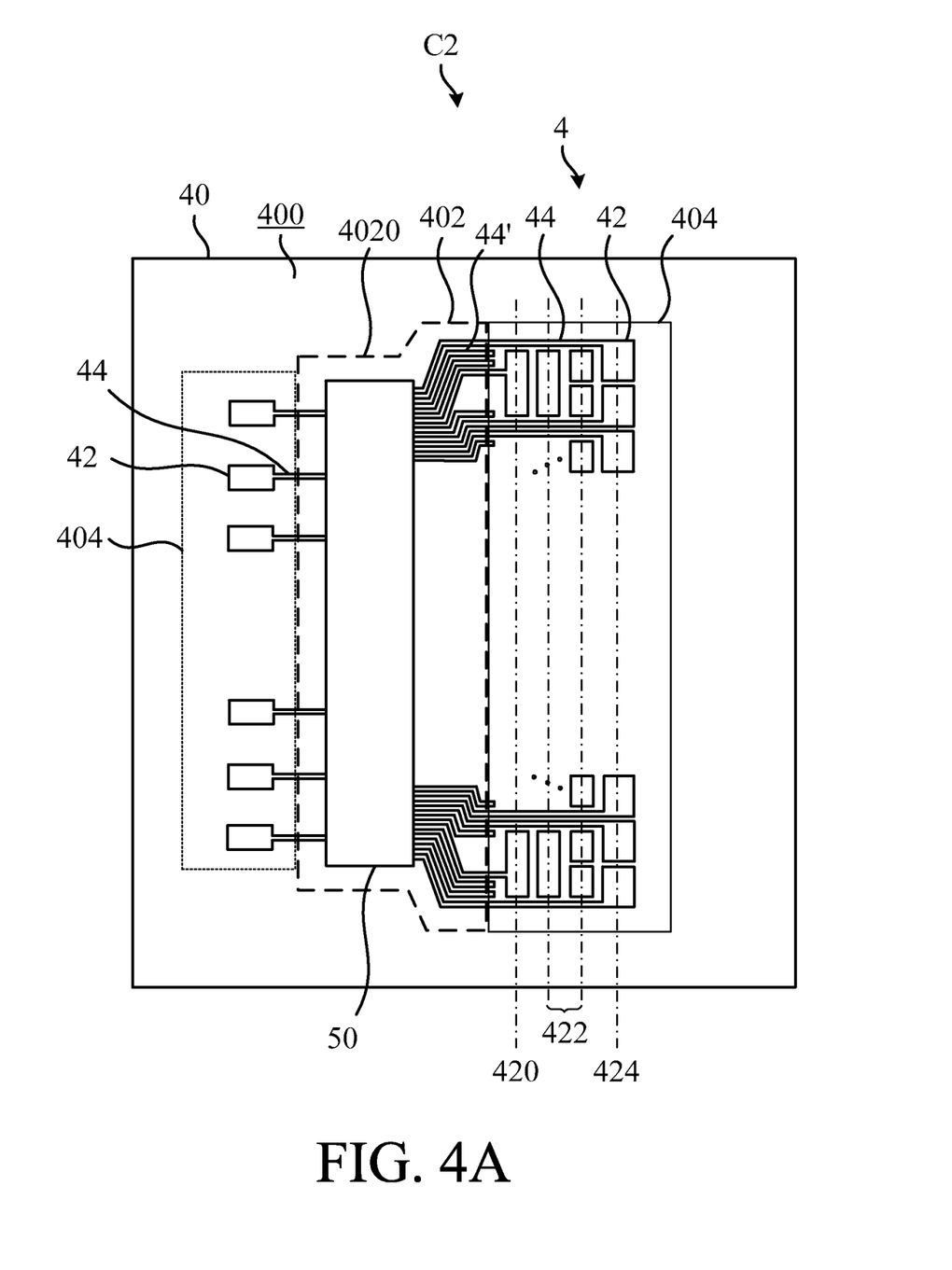
FIG. 4A is a schematic diagram illustrating a chip packaging structure according to another embodiment of the invention.

Please refer to FIG. 4A, which is a schematic diagram illustrating a chip packaging structure C2 according to another embodiment of the invention. As shown in FIG. 4A, the chip packaging structure C2 in the embodiment comprises a chip packaging substrate 4 and a chip 50. The chip packaging substrate 4 further comprises a flexible substrate 40, a plurality of test pads 42 and leads 44, wherein the test pads 42, the leads 44 and the chip 50 are configured on the flexible substrate 40. The difference between this embodiment and the previous embodiment is the arrangement of the test pads 42 on the test pad area 404. Besides, other components of this embodiment are substantially the same as the previous embodiment, thus need not be elaborated any further.

Figure 4B:
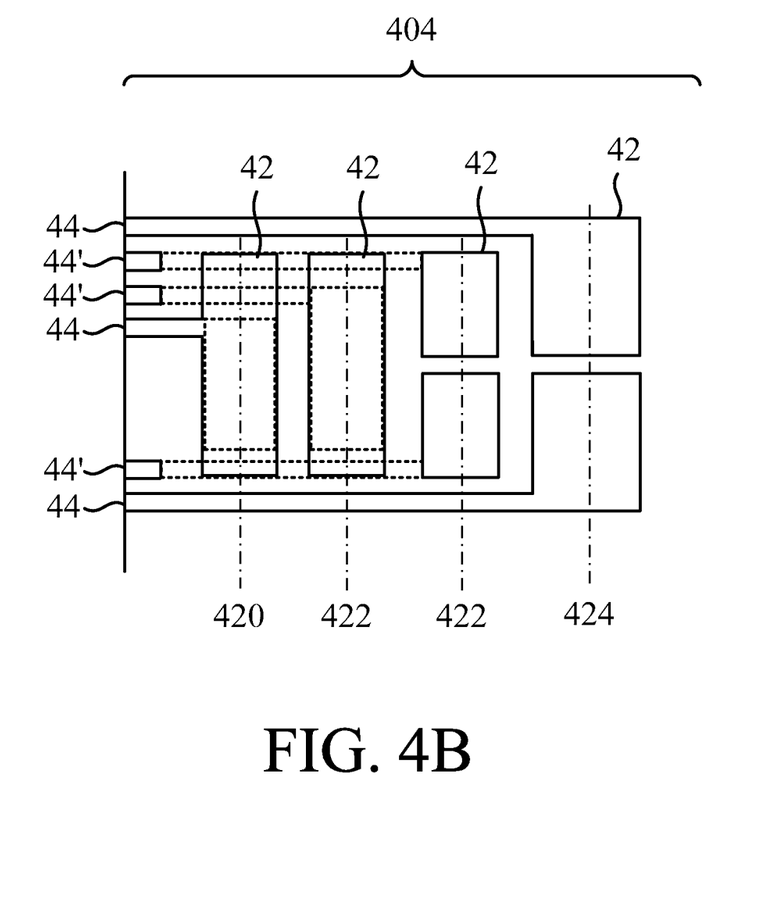
FIG. 4B is an enlarged view illustrating the test pad area of the chip packaging substrate according to FIG. 4A.

Please refer to FIG. 4B and 2B. FIG. 4B is an enlarged view illustrating the test pad area 404 of the chip packaging substrate 4 according to FIG. 4A. As shown in FIG. 4B, the leads 44 comprise the first leads 44' connected to the test pads 42 in the middle rows 422. Similarly, the first leads 44' comprise the first sections and the second sections. The second sections are configured on the second surface of the flexible substrate 40 without occupying the layout space available on the test pad area 404. Accordingly, the dimensions of the test pads 42 arranged in the innermost row 420 and the middle rows 422 can be increased so that the possibility of probes being slipped out of the test pads 42 can be prevented and the testing accuracy can be ensured.

Similar to the previous embodiment, in order to increase the dimensions of the test pads and to have the trimmed-off chip packaging structure C2 being fixed on-board smoothly, the second ends of the first sections of the first leads 44' can terminate at a region between the cutting line 4020 and the test pads 42 arranged in the innermost row 420, so as to avoid the first leads 44' occupying too much space of the test pad area 404 and meanwhile to have all the leads 42 of the individual chip packaging structure C2 after trimmed off being disposed on the first surface.

Compared with the prior art, the leads connected to the test pads in the middle rows are partially configured on the surface opposite to the test pad area; accordingly, the layout space available on the test pad area is increased as well as the dimensions of the test pads, so that the possibility of probes being slipped out of the test pads causing testing inaccuracy can be prevented. Furthermore, all of the leads within the user area are disposed entirely on the same surface of the chip packaging substrate. Therefore, after the user area is trimmed into a single chip packaging structure, the leads can be connected with a glass panel and a printed circuit board directly, causing no difficulty to the on-board application.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims

The invention claimed is:

1. A chip packaging substrate, comprising:
   a flexible substrate, having a first surface and a second surface opposite to the first surface, the first surface having a user area for a chip to be mounted thereon and a test pad area configured thereon, wherein the test pad area is adjacent to the user area, and the user area is defined by a cutting line which serves as a boundary between the user area and the test pad area;
   a plurality of test pads, configured in the test pad area and arranged in at least three rows, wherein the at least three rows are divided into an innermost row, at least one middle row, and an outermost row from nearest to farthest from the user area; and
   a plurality of leads, at least formed on the user area, wherein one end of each lead is electrically connected to the chip, the other end of each lead extends toward the test pad area and is connected to the corresponding test pad, and the leads have at least one first lead comprising:
   a first section, configured on the first surface, wherein a first end of the first section is electrically connected to the chip, and a second end opposite to the first end of the first section extends into the test pad area; and
   a second section, configured on the second surface and entirely situated within a range of test pad area projects on the second surface, wherein one end of the second section penetrates the flexible substrate to connect with the second end of the first section and the other end of the second section penetrates the flexible substrate to connect with the corresponding test pad which is arranged in the at least one middle row.

2. The chip packaging substrate of claim 1, wherein the second end of the first section of the at least one first lead terminates at a region between the cutting line and the test pads arranged in the innermost row.

3. The chip packaging substrate of claim 1, wherein the second section of the at least one first lead comprises two conductive vias penetrating the flexible substrate, and the two conductive vias connect the second section to the second end of the first section and the corresponding test pad respectively.

4. A chip packaging structure, comprising:
   a chip; and
   a chip packaging substrate, comprising:
   a flexible substrate, having a first surface and a second surface opposite to the first surface, the first surface having a user area and a test pad area configured thereon, wherein the test pad area is adjacent to the user area, and the area is defined by a cutting line which serves as a boundary between the user area and the test pad area, and the chip is mounted on the user area;
   a plurality of test pads, configured in the test pad area and arranged in at least three rows, wherein the at least three rows are divided into an innermost row, at least one middle row, and an outermost row from nearest to farthest from the user area; and
   a plurality of leads, at least formed on the user area, wherein one end of each lead is electrically connected to the chip, the other end of each lead extends toward the test pad area and is connected to the corresponding test pad, and the leads have at least one first lead comprising:
   a first section, configured on the first surface, wherein a first end of the first section is electrically connected to the chip, and a second end opposite to the first end of the first section extends into the test pad area; and
   a second section, configured on the second surface and entirely situated within a range of test pad area projects on the second surface, wherein one end of the second section penetrates the flexible substrate to connect with the second end of the first section and the other end of the second section penetrates the flexible substrate to connect with the corresponding test pad which is arranged in the at least one middle row.

5. The chip packaging structure of claim 4, wherein the second end of the first section of the at least one first lead terminates at a region between the cutting line and the test pads arranged in the innermost row.

6. The chip packaging structure of claim 4, wherein the second section of the at least one first lead comprises two conductive vias penetrating the flexible substrate, and the two conductive vias connect the second section to the second end of the first section and the corresponding test pad respectively.

* * * * *